United States Patent [19]
Yamazaki

[11] Patent Number: 5,904,567
[45] Date of Patent: May 18, 1999

[54] LAYER MEMBER FORMING METHOD

[75] Inventor: Shunpei Yamazaki, Tokyo, Japan

[73] Assignee: Semiconductor Energy Laboratory Co., Ltd., Kanagawa, Japan

[21] Appl. No.: 08/929,365

[22] Filed: Sep. 9, 1997

Related U.S. Application Data

[62] Division of application No. 08/659,636, Jun. 6, 1996, which is a division of application No. 08/351,140, Nov. 30, 1994, Pat. No. 5,650,013, which is a continuation of application No. 08/064,212, May 12, 1993, abandoned, which is a division of application No. 07/842,758, Feb. 28, 1992, abandoned, which is a continuation of application No. 07/595,762, Oct. 3, 1990, abandoned, which is a continuation of application No. 07/312,420, Feb. 21, 1989, abandoned, which is a continuation of application No. 07/092,130, Sep. 2, 1987, abandoned, which is a division of application No. 06/801,768, Nov. 26, 1985, abandoned.

[30] Foreign Application Priority Data

Nov. 26, 1984 [JP] Japan .................................. 59-250340

[51] Int. Cl.$^6$ .................................................. H01L 21/00
[52] U.S. Cl. .......................... 438/689; 134/1.1; 156/345; 216/67; 438/793
[58] Field of Search .......................... 156/345 P; 216/37, 216/66, 67; 134/1.1; 438/788–790, 792–794, 905

[56] References Cited

U.S. PATENT DOCUMENTS

| | | | |
|---|---|---|---|
| 3,228,812 | 1/1966 | Blake | 427/93 X |
| 3,338,209 | 8/1967 | Bhola | 118/49.5 |

(List continued on next page.)

FOREIGN PATENT DOCUMENTS

| | | | |
|---|---|---|---|
| 2397067 | 2/1979 | France . | |
| 3144016 A1 | 7/1982 | Germany | 118/723 MR |
| 54-033688 | 3/1979 | Japan . | |

(List continued on next page.)

OTHER PUBLICATIONS

Itoh et al., Ionics, Jul. 1981.

Webster's New World Dictionary, Third College Edition, 1988, p. 707.

Brodsky et al., Method of Preparing Hydrogenated Amorphous Silicon, IBM Technical Disclosure Bulletin, vol. 22, N 8A pp. 3391–3392.

High–Conductive Wide Band Gap P–Type a: S:C:H Prepared by ECR CVD and its Application to High Efficiency a–S; Basis Solar Cells, Y. Hattori et al., Presented at 19th IEEE PVSC (New Orleans) May 4–8, 1987, pp. 1–6.

"Reactive Ion Beam Etching Using a Broad Beam ECR Ion Source", S. Matsuo and Y. Adachi, Japanese Journal of Applied Physics, vol. 21, No. 1, Jan., 1982, pp. L4–L6.

Journal of Vacuum Science & Technology: H. Frederick Dylla "Turbomolecular Pump Vacuum System for the Princeton Large Torus" Plasma Physics Laboratory, Princeton University, Princeton, New Jersey 08540; (Received Sep. 29, 1977; accepted Nov. 21, 1977); vol. 15, No. 2, pp. 734–740, 1978.

(List continued on next page.)

*Primary Examiner*—William Powell
*Attorney, Agent, or Firm*—Sixbey, Friedman, Leedom & Ferguson, P.C.; Gerald J. Ferguson, Jr.; Jeffrey L. Costellia

[57] ABSTRACT

A chemical vapor reaction method including (a) introducing a first reactive gas into a reaction chamber; (b) exciting the first reactive gas to form a first film over a substrate; (c) introducing a second reactive gas into the reaction chamber after the formation of the first film; (d) exciting the second reactive gas to form a second film on the first film wherein the first film constitutes one of a semiconductor material and an insulating material while the second film constitutes the other one of the semiconductor material and the insulating material; (e) introducing a cleaning gas including nitrogen fluoride into the reaction chamber; and (f) exciting the cleaning gas in order to perform a cleaning in the inside of the reaction chamber.

24 Claims, 1 Drawing Sheet

U.S. PATENT DOCUMENTS

| | | |
|---|---|---|
| 3,404,661 | 10/1968 | Mathias et al. . |
| 3,485,666 | 12/1969 | Sterling et al. .............................. 427/37 |
| 3,627,590 | 12/1971 | Mammel . |
| 3,661,637 | 5/1972 | Sirtl . |
| 3,967,981 | 7/1976 | Yamazaki ................................. 148/1.5 |
| 4,006,340 | 2/1977 | Gorinas ................................. 219/121 P |
| 4,033,287 | 7/1977 | Alexander, Jr. et al. ............ 118/723 E |
| 4,088,456 | 5/1978 | Giorgi et al. .............................. 55/179 |
| 4,123,316 | 10/1978 | Tsuchimoto ............................. 156/643 |
| 4,138,306 | 2/1979 | Niwa . |
| 4,149,307 | 4/1979 | Henderson ............................. 156/652 |
| 4,151,537 | 4/1979 | Goldman et al. ........................ 357/23 |
| 4,183,780 | 1/1980 | McKenna ................................. 427/38 |
| 4,223,048 | 9/1980 | Engle, Jr. ................................. 427/39 |
| 4,282,267 | 8/1981 | Küyel ................................. 427/38 |
| 4,330,570 | 5/1982 | Giuliani et al. ........................... 427/64 |
| 4,332,522 | 6/1982 | Saulgeot ................................. 415/90 |
| 4,342,617 | 8/1982 | Fu et al ................................. 156/643 |
| 4,365,107 | 12/1982 | Yamauchi ................................. 427/39 |
| 4,371,587 | 2/1983 | Peters ................................. 427/53.1 |
| 4,380,488 | 4/1983 | Reichelderfer et al. ............ 156/345 X |
| 4,401,054 | 8/1983 | Matsuo ................................. 118/723 |
| 4,402,997 | 9/1983 | Hogan et al. ......................... 118/71.5 |
| 4,435,445 | 3/1984 | Allred et al. .......................... 427/54.1 |
| 4,438,368 | 3/1984 | Abe ................................. 315/39 |
| 4,451,503 | 5/1984 | Blum et al. ............................. 427/53.1 |
| 4,461,783 | 7/1984 | Yamazaki ................................. 427/39 |
| 4,481,229 | 11/1984 | Suzuki ................................. 427/47 |
| 4,481,230 | 11/1984 | Hanak . |
| 4,492,716 | 1/1985 | Yamazaki . |
| 4,495,218 | 1/1985 | Azuma et al. ......................... 427/53.1 |
| 4,496,423 | 1/1985 | Walton ................................. 156/345 |
| 4,501,766 | 2/1985 | Suzuki et al. ........................ 118/50.1 |
| 4,503,807 | 3/1985 | Nakayama et al. . |
| 4,509,451 | 4/1985 | Collins et al. ............................. 427/39 |
| 4,522,663 | 6/1985 | Ovshinsky et al. . |
| 4,522,674 | 6/1985 | Ninomiya ................................. 156/345 |
| 4,525,382 | 6/1985 | Sugioka ................................. 427/54.1 |
| 4,529,474 | 7/1985 | Fujiyama et al. ....................... 156/643 |
| 4,529,475 | 7/1985 | Okano et al. ........................... 156/643 |
| 4,530,818 | 7/1985 | Gutermann ............................. 422/240 |
| 4,532,022 | 7/1985 | Takasaki et al. ..................... 204/192 D |
| 4,532,196 | 7/1985 | Yasui et al. ............................. 427/39 |
| 4,532,199 | 7/1985 | Ueno ................................. 427/39 |
| 4,534,033 | 8/1985 | Nishizawa et al. ....................... 372/50 |
| 4,534,816 | 8/1985 | Chen et al. . |
| 4,539,068 | 9/1985 | Takagi et al. ............................. 156/614 |
| 4,543,465 | 9/1985 | Sakudo ............................ 219/121 PD |
| 4,544,423 | 10/1985 | Tsuge et al. .............................. 427/74 |
| 4,550,684 | 11/1985 | Mahawili . |
| 4,563,367 | 1/1986 | Sherman ................................. 427/39 |
| 4,564,997 | 1/1986 | Matsuo ................................. 427/47 |
| 4,568,565 | 2/1986 | Gupta et al. .......................... 427/255.2 |
| 4,576,698 | 3/1986 | Gallagher et al. .................. 204/192 E |
| 4,581,100 | 4/1986 | Hatzakis et al. ........................ 156/643 |
| 4,585,541 | 4/1986 | Miyake ................................. 204/298 |
| 4,598,665 | 7/1986 | Tanaka ................................. 118/715 |
| 4,608,063 | 8/1986 | Kurokawa ................................. 55/208 |
| 4,608,117 | 8/1986 | Ehrlich et al. ......................... 427/53.1 |
| 4,615,298 | 10/1986 | Yamazaki ................................. 118/723 |
| 4,624,736 | 11/1986 | Gee ................................. 118/728 |
| 4,625,678 | 12/1986 | Shioya et al. ........................... 118/723 |
| 4,629,635 | 12/1986 | Brors ................................. 427/255.2 |
| 4,636,401 | 1/1987 | Yamazaki ................................. 118/723 |
| 4,645,684 | 2/1987 | Osada ................................. 427/38 |
| 4,654,226 | 3/1987 | Jackson et al. ........................ 427/54.1 |
| 4,655,800 | 4/1987 | Tsukada et al. ........................... 55/208 |
| 4,657,616 | 4/1987 | Benzing et al. . |
| 4,664,938 | 5/1987 | Walker ........................ 118/723 MP X |
| 4,668,365 | 5/1987 | Foster ................................. 427/47 |
| 4,681,653 | 7/1987 | Purdes et al. ............................. 427/39 |
| 4,683,838 | 8/1987 | Kimura ................................. 118/715 |
| 4,687,544 | 8/1987 | Bersin ................................. 156/345 |
| 4,693,211 | 9/1987 | Ogami et al. . |
| 4,695,331 | 9/1987 | Romaprasud ......................... 427/54.1 |
| 4,695,700 | 9/1987 | Provence et al. . |
| 4,699,805 | 10/1987 | Seelback et al. ...................... 118/71.5 |
| 4,702,934 | 10/1987 | Ishihara et al. ........................... 427/39 |
| 4,713,258 | 12/1987 | Umemura ................................. 427/35 |
| 4,726,963 | 2/1988 | Ishihara et al. ........................ 427/53.1 |
| 4,728,528 | 3/1988 | Ishihara et al. ........................ 427/53.1 |
| 4,745,088 | 5/1988 | Inoue et al. . |
| 4,747,368 | 5/1988 | Brien et al. . |
| 4,759,947 | 7/1988 | Ishihara et al. ........................ 427/53.1 |
| 4,762,728 | 8/1988 | Keyser et al. ........................... 427/99 |
| 4,767,641 | 8/1988 | Kieser et al. . |
| 4,811,684 | 3/1989 | Tashiro et al. ........................ 427/53.1 |
| 4,828,369 | 5/1989 | Hotomi ................................. 350/357 |
| 4,857,139 | 8/1989 | Tashiro et al. ........................ 118/50.1 |
| 4,883,560 | 11/1989 | Ishihara ........................ 118/723 MP X |
| 4,909,914 | 3/1990 | Chiba ................................. 204/164 |
| 4,913,929 | 4/1990 | Moslehi ................................. 427/39 |
| 4,915,979 | 4/1990 | Ishida ................................. 118/723 |
| 4,919,077 | 4/1990 | Oda et al. ........................ 118/723 MP |
| 4,947,085 | 8/1990 | Nakanishi ......................... 315/111.41 |
| 4,960,488 | 10/1990 | Law et al. . |
| 4,982,138 | 1/1991 | Fujiwara ............................. 315/11.41 |
| 5,000,113 | 3/1991 | Wang et al. . |
| 5,034,086 | 7/1991 | Sato ................................. 156/345 |
| 5,081,398 | 1/1992 | Asmussen ........................ 314/111.41 |
| 5,094,966 | 3/1992 | Yamazaki ................................. 437/40 |
| 5,110,619 | 5/1992 | Ogumi et al. ........................... 118/723 |
| 5,158,644 | 10/1992 | Cheung et al. . |
| 5,207,836 | 5/1993 | Chang ................................. 134/1 |
| 5,211,825 | 5/1993 | Saito ................................. 204/298.32 |
| 5,230,931 | 7/1993 | Yamazaki ................................. 427/569 |
| 5,283,087 | 2/1994 | Yamazaki ................................. 427/577 |
| 5,487,787 | 1/1996 | Cann ................................. 118/723 R |
| 5,499,411 | 3/1996 | Fukuda ........................ 118/723 MP |
| 5,503,676 | 4/1996 | Shufflebotham ................ 118/723 MR |
| 5,512,102 | 4/1996 | Yamazaki ...................... 118/723 MW |

FOREIGN PATENT DOCUMENTS

| | | |
|---|---|---|
| 54-59878 | 5/1979 | Japan . |
| 55-6410 | 1/1980 | Japan . |
| 55-21553 | 2/1980 | Japan . |
| 55-78524 | 6/1980 | Japan . |
| 5739430 | 8/1980 | Japan . |
| 55-141570 | 11/1980 | Japan . |
| 56-110236 | 9/1981 | Japan . |
| 57-149748 | 9/1982 | Japan . |
| 57-166310 | 10/1982 | Japan . |
| 57-201016 | 12/1982 | Japan . |
| 58-92217 | 6/1983 | Japan . |
| 58-92218 | 6/1983 | Japan . |
| 58-93321 | 6/1983 | Japan . |
| 58-95550 | 6/1983 | Japan . |
| 58-97826 | 6/1983 | Japan . |
| 59-52833 | 3/1984 | Japan . |
| 59-52834 | 3/1984 | Japan . |
| 59-56725 | 4/1984 | Japan . |
| 59-123766 | 7/1984 | Japan . |
| 59-129772 | 7/1984 | Japan . |
| 59-145779 | 8/1984 | Japan . |
| 59-145780 | 8/1984 | Japan . |
| 59-216625 | 12/1984 | Japan . |
| 60-033300 | 2/1985 | Japan . |
| 60-167318 | 8/1985 | Japan . |
| 60-180999 | 9/1985 | Japan ................................. 423/466 |
| 60-245217 | 12/1985 | Japan ........................ 118/723 MP |
| 61-99682 | 6/1986 | Japan . |
| 61-143579 | 7/1986 | Japan . |
| 62-89882 | 4/1987 | Japan . |
| 62-120477 | 6/1987 | Japan . |
| 62-143418 | 6/1987 | Japan . |
| 1-275761 | 11/1989 | Japan ................................. 118/723 |
| 2-232372 | 9/1990 | Japan ........................ 118/723 MP |
| 1151746 | 5/1969 | United Kingdom . |

| | | |
|---|---|---|
| 8606687 | 11/1986 | WIPO . |
| 8707309 | 12/1987 | WIPO . |

OTHER PUBLICATIONS

"A User's Guide to Vacuum Technology" by John F. O'Hanlon, Research Staff Member IBM Thomas J. Watson Research Center.

Ghandhi, *VLSI Fabrication Principles,* John Wiley & Sons, 1983, pp. 517–520.

Lakatos, 1982 International Display Research Conference, IEEE, pp. 146–151.

Chen et al., "Photo–CVD for VLSI Isolation", J. Electrochem. Soc., V. 131, No. 9, pp. 2146–2151 (Sep. 1984).

LAYER MEMBER FORMING METHOD

This is a Divisional application of Ser. No. 08/659,636, filed Jun. 6, 1996; which itself is a division of Ser. No. 08/351,140, filed Nov. 30, 1994, U.S. Pat. No. 5,650,013; which is a continuation of Ser. No. 08/064,212, filed May 12, 1993, now abandoned; which itself is a division of Ser. No. 07/842,758, filed Feb. 28, 1992, now abandoned; which is a continuation of Ser. No. 07/595,762, filed Oct. 3, 1990, now abandoned; which is a continuation of Ser. No. 07/312,420, filed Feb. 21, 1989, now abandoned; which is a continuation of Ser. No. 07/092,130, filed Sep. 2, 1987, now abandoned; which is a division of Ser. No. 06/801,768, filed Nov. 26, 1985, now abandoned.

BACKGROUND OF THE INVENTION

1. Field of the Invention

The present invention relates to a layer member forming method which is suitable for use in the fabrication of various electronic devices of the type having an insulating, protecting, conductive, semiconductor or like layer member formed on a substrate member.

2. Description of the Prior Art

Heretofore there has proposed a method for forming such a layer member on a substrate member through use of a photo CVD or plasma CVD process.

According to the method utilizing the photo CVD technique, the substrate is placed in a reaction chamber provided with a light transparent window and a reactive gas mixture, which contains at least a gas of a material for the formation of the layer member desired to obtain, is introduced into the reaction chamber. Then light is introduced into the reaction chamber through the light transparent window thereof by which the reactive gas mixture introduced thereinto is excited for vapor-phase decomposition and the material for the layer is deposited on the substrate member.

With the method utilizing the plasma CVD technique, the substrate is placed in a reaction chamber and a reactive gas mixture, which contains a gas of a material for the formation of the layer, is introduced into the reaction chamber. In the reaction chamber the reactive gas mixture is excited into a plasma by grow discharge or electron cyclotron resonance for vapor-phase decomposition by high frequency electric power so that the material for the layer is deposited on the substrate.

With the photo CVD process, since the material gas resulting from the vapor-phase decomposition of the photo-excited reactive gas is not accelerated, it is possible to form the layer on the substrate with substantially no damage inflicted on the substrate surface. On this account the layer can easily be formed without containing the material forming the substrate surface or without introducing into the substrate surface the material forming the layer, without developing any undesirable interface level between the layer and the substrate and without applying any internal stress to the layer and the substrate. Furthermore, since the photo-excited material gas has a characteristic to spread on the surface of the substrate member, the layer can be deposited in close contact with the substrate even if the substrate surface is uneven.

Accordingly, the use of the photo CVD technique permits easy formation of the layer of desired characteristics, without causing any damages to the substrate surface, even if the substrate has an uneven surface.

With the photo CVD process, however, since the photo-excited material gas is not accelerated toward the substrate, the deposition rate of the layer is lower than in the case of employing the plasma CVD technique. Therefore, the photo CVD process takes much time for forming the layer as compared with the plasma CVD process. Furthermore, the material for the layer is deposited as well on the light transparent window during the formation of the layer, causing a decrease in the light transmittivity of the window as the deposition proceeds. Therefore, the layer cannot be formed to a large thickness. For instance, in the case of forming a silicon nitride layer, it is difficult, in practice, to deposit the layer to a thickness greater than 1000 A. Moreover, difficulties are encountered in forming a silicon layer to a thickness greater than 200 A, a silicon oxide ($SiO_2$), or aluminum nitride (AlN) layer to a thickness greater than 3000 A, a silicon carbide ($Si_{x}C_{1-x}$, where $0<x<1$) layer to a thickness greater than 500 A and a germanium silicide ($Si_xGe_{1-x}$, where $0<x<1$) or metal silicide ($SiM_x$, where M is metal such as Mo, W, In, Cr, Sn Ga or the like and $0 (X\leq4)$ layer to a thickness greater than 100 to 200 A.

with the plasma CVD process, since the material gas resulting from the vapor decomposition of the reactive gas excited by electric power can be accelerated toward the substrate, the deposition rate of the layer is higher than in the case of using the photo CVD process. Therefore, the layer can be formed on the substrate in a shorter time than is needed by the photo CVD technique. Furthermore, even if the material for the layer is deposited on the interior surface of the reaction chamber as well as on the substrate, no limitations are imposed on the excitation of the reactive gas by electric power. Consequently, the layer can easily be formed to a desired thickness on the substrate.

With the plasma CVD technique, however, since the material gas excited by electric power is accelerated by an electric field, it is difficult to deposit the layer on the substrate without causing damage to its surface. On account of this, the layer contains the material forming the substrate surface, or the substrate surface contains the material forming the layer. Moreover, an interface level is set up between the layer and the substrate and internal stresses are applied to the layer and the substrate.

Besides, in the case of employing the plasma CVD technique, since the excited material gas is accelerated by an electric field and its free running in the reaction chamber is limited, there is the possibility that when the substrate surface is uneven, the layer cannot be formed in close contact therewith, that is, the layer cannot be deposited with desired characteristics.

SUMMARY OF THE INVENTION

It is therefore an object of the present invention to provide a novel layer member forming method which is free from the abovesaid defects of the prior art.

The layer member forming method of the present invention comprises the steps of depositing a layer of a desired material on a substrate by the photo CVD technique and depositing on the first layer a second layer of a material identical with or different from that of first layer by the plasma CVD technique, thereby forming a layer member composed of at least the first and second layers.

According to such a method of the present invention, since the first layer is deposited by the photo CVD technique on the substrate, even if the substrate surface is uneven, the first layer can be deposited in close contact with the substrate surface and with substantially no damage thereon.

Accordingly, the first layer does not substantially contain the material forming the substrate surface, or the substrate surface does not substantially contain the material forming the first layer. Further, the deposition of the first layer is not accompanied by provision of an undesirable interface level between the first layer and the substrate and the application of internal stresses to the first layer and the substrate. In addition, since the second layer is deposited by the plasma CVD technique on the first layer, the second layer can easily be formed to a desired thickness in a short time.

In accordance with an aspect of the present invention, by forming the first and second layers as insulating, protecting or conductive layers of the same or different types or compositions, the layer member as a insulating, protecting or conductive layer member of desired characteristics can easily be deposited to desired thickness in a short time without inflicting damage on the substrate surface.

In accordance with another aspect of the present invention, by forming the first and second layers as semiconductive layers of the same type or composition, the layer member as a semiconductor layer member can easily be deposited to a desired thickness in a short time without inflicting damage to the substrate surface.

In accordance with another aspect of the present invention, by forming the first and second layers as semiconductor layers of different types or compositions, the layer member can easily be deposited as a semiconductor layer member composed of a first semiconductor layer which may preferably be relatively thin and a second semiconductor layer which may preferably be relatively thick, in a short time without causing damage to the substrate surface.

In accordance with another aspect of the present invention, by forming the first and second layers as an insulating layers and as a conductive or semiconductor layer, respectively, the layer member as a composite layer member can easily be deposited including a conductive or semiconductor layer formed to a desired thickness on the insulating layer of the least possible thickness, in a short time without impairing the substrate surface.

In accordance with yet another aspect of the present invention, by forming the first and second layers as a conductive or semiconductor layer and as an insulating or protecting layer, respectively, the layer member as a composite layer member can easily be deposited including an insulating or protecting layer formed to a desired thickness on the conductive or semiconductive layer of the least possible thickness, in a short time without impairing the substrate surface.

Other objects, features and advantages of the present invention will become more fully apparent from the following description taken in conjunction with the accompanying drawings.

BRIEF DESCRIPTION OF THE DRAWING

The accompanying sheet of a drawing denominated as FIG. 1 schematically illustrates an example of the layer forming method of the present invention and an example of apparatus used therefor.

DESCRIPTION OF THE PREFERRED EMBODIMENTS

Figure 1:
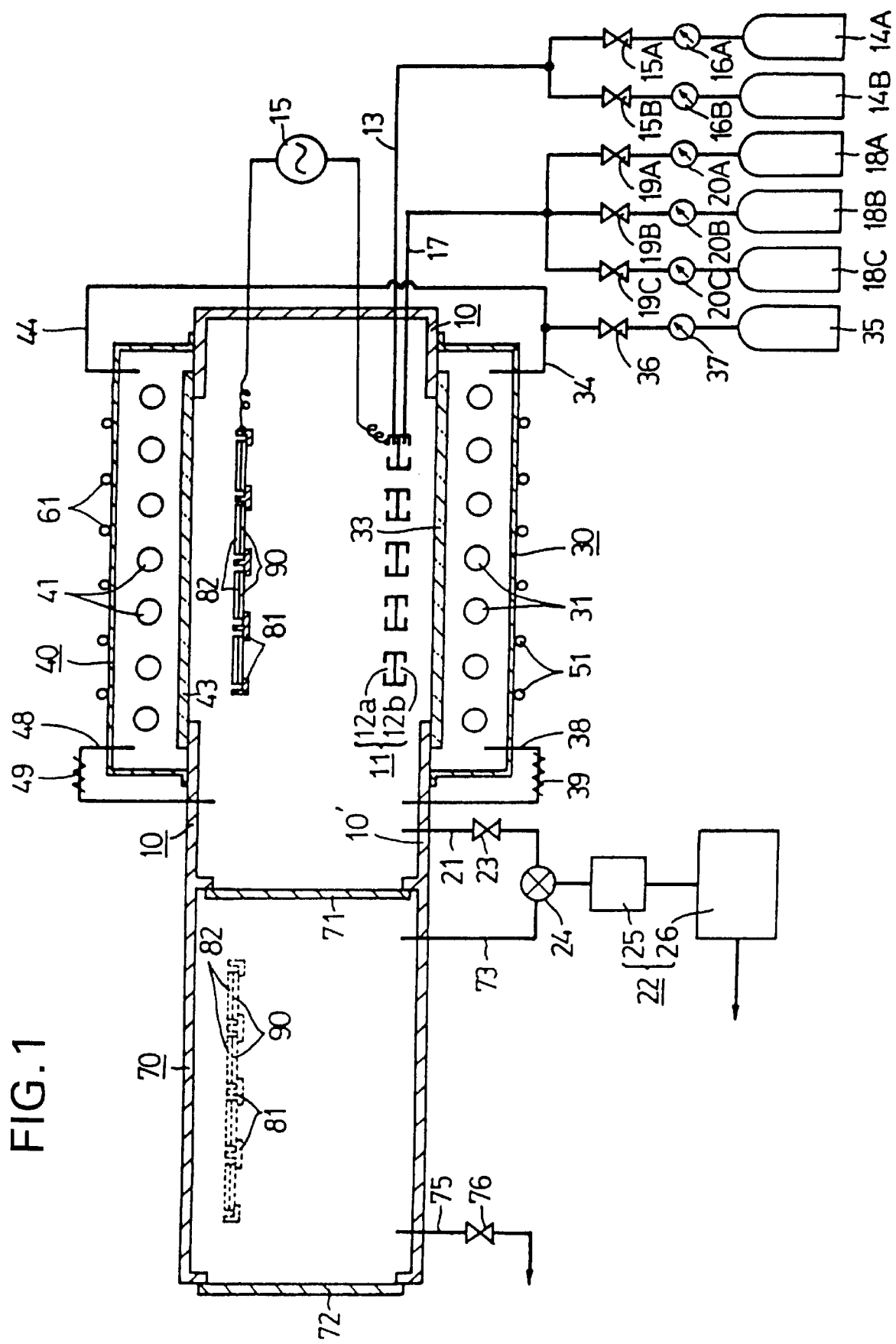

A description will be given first of an apparatus for the formation of a layer member according to the present invention.

The apparatus has a conductive reaction chamber 10. The reaction chamber 10 is provided with a plurality of conductive nozzles 11 arranged at the lower portion of the chamber 10 and each having upper and lower nozzle parts 12a and 12b. The conductive nozzles 11 are connected to one end of a power supply 15 for gas excitation.

A gas introducing pipe 13 is connected to the upper nozzle parts 12a of the nozzle 11 and extends out of the reaction chamber 10. The gas introducing pipe 13 is connected to a gas source 14A via a valve 15A and a flowmeter 16A and to another gas source 14B via a valve 15B and a flowmeter 16B.

Another gas introducing pipe 17 is connected to the lower nozzle parts 12b of the nozzle 11 and extends out of the reaction chamber 10. The gas introducing pipe 17 is connected to a gas source 18A via a valve 18A and a flowmeter 20A, to a gas source 18B via a valve 19B and a flowmeter 20B and to a gas source 18C via a valve 19C and a flowmeter 20C.

The reaction chamber 10 is provided with an exhaust pipe 21 which extends to the outside through the bottom wall of its extending portion 10' wherein the nozzles 11 are not placed. The exhaust pipe 21 is connected to a vacuum pump system 22 via a control valve 23 and a change-over valve 24. The vacuum pump system 22 has a tandem structure of a turbo pump 25 and a rotary pump 26.

Provided on the bottom wall of the reaction chamber 10 is a light source chamber 30, in which is disposed light sources 31 each of which emits light having a wavelength 300 nm or less, such as a low pressure mercury lamp. The light sources 31 are connected to an external power supply (not shown). Provided on the bottom wall of the chamber 30 are cooling pipes 51 which are connected to a cooling tower (not shown).

The reaction chamber 10 and the light source chamber 30 optically intercommunicate through a window 33 made in, for instance, a quartz plate disposed therebetween.

The light source chamber 30 has a gas introducing pipe 34 which extends to the outside through its one end portion of the bottom wall. The gas introducing pipe 34 is connected to a gas source 35 via a valve 36 and folwmeter 37. The light source chamber 30 has an exhaust pipe 38 which extends from the other end portion of the bottom wall of the chamber 30 into the extending portion 10' of the reaction chamber 10. A heater 39 is provided on the exhaust pipe 38.

Disposed on the upper wall of the reaction chamber 10 is a heat source chamber 40, in which is disposed a heat source 41 formed by, for example, a halogen lamp. The heat source 41 is connected to anexternal power supply (not shown). Provided on the top wall of the chamber 40 is costing pipes 61 which are connected to the abovesaid costing tower, The reaction chamber 10 and the heat source chamber 40 thermally intercommunicate through a window 43 made in, for example, quartz plate disposed there between.

The light source chamber 40 has a gas introducing pipe 44 which extends through its one end portion of the upper wall to the outside and is connected to abovesaid gas source 35 via the valve 36 and the flowmeter 37. The heat source chamber 40 has an exhaust pipe 48 which extends from its other end portion of the upper wall into the extending portion 10' of the reaction chamber 10. A heater 49 is provided on the exhaust pipe 48.

The reaction chamber 10 has attached thereto on the side of its extending portion 10' a substrate take-in/take-out chamber 70 with a shutter means 71 interposed therebetween. The shutter means 71 is selectively displaced to permit or inhibit the intercommunication therethrough between the chambers 10 and 70.

The chamber 70 has another shutter means 72 on the opposite side from the shutter means 71. The chamber 70 has an exhaust pipe 73 which extends from its bottom to the vacuum system 22 via the aforementioned change-over valve 24. The chamber 70 has another pipe 75 which extends to the outside and terminates into the atmosphere via a valve 76.

The apparatus includes a conductive holder 81 for mounting a plurality of substrate members 90. The holder 81 is combined with thermally conductive press plates 82 for placing on the substrate members 90 mounted on the holder 81.

According to an example of the present invention, the abovesaid layer member is deposited on the substrate member 90 through use of such an apparatus, as described hereinafter.

Embodiment 1

A description will given of a first embodiment of the present invention for forming the layer member as a insulating layer member on the substrate member 90.

(1) The shutter means 71 between the reaction chamber 10 and the substrate take-in/take-out chamber 70, the shutter means 72 of the chamber 70 a valve 76 between the chamber 70 and the outside, the valves 15A and 15B between the nozzle parts 12a and the gas sources 14A and 14B, the valve 19A, 19B and 19C between the nozzle parts 12b and the gas sources 18A, 18B and 18C and the valve 36 between the chambers 30 and 40 and the gas source 35 are closed.

(2) Next, the valve 23 between the reaction chamber 10 and the vacuum pump system 22 is opened and change-over valve 24 is also opened to the both chambers 10, 70, 30 and 40 to a pressure of $10_{-7}$ Torr.

(3) Next, the turbo pump 25 and the rotary pump 26 of the vacuum pump system 22 are activated, evacuating the chambers 10 and 70.

(4) Next, the valve 23 is closed and the change-over valve 24 is also closed relative to the both chambers 10 and 70, followed by stopping of the vacuum pump system 22 from operation.

(5) Next, the valve 76 is opened, raising the pressure in the chamber 70 up to the atmospheric pressure.

(6) Next, the shutter means 72 is opened, through which the substrate 90 mounted on a holder 81 with, its surface for the formation thereon of the layer held down, is placed in the chamber 70 with a press plate 82 mounted on the substrate 90.

(7) Next, the shutter means 72 and the valve 76 are closed.

(8) Next, the change-over valve 24 is opened to the chamber 70 alone and the pump system 22 is activated, evacuating the chamber 70 to substantially the same vacuum as that in which the chamber 10 is retained.

(9) Next, the change-over valve 24 is closed relative to the both chambers 10 and 70 and then the pump system 22 is stopped from operation.

(10) Next, the shutter means 71 is opened, the holder 81 carrying the substrate 90 is moved from the chamber 70 into the chamber 10 and disposed at a predetermined position in the upper part of the chamber 10. At this time, the holder 81 is connected to the other end of the power source 15.

(11) Next, the shutter means 71 is closed.

(12) Next, the heat source 41 in the heat source chamber 40 is turned ON, heating the substrate 90 up to a temperature of 350° C.

(13) Next, the light source 31 in the light source chamber 30 is turned ON.

(14) Next, the valve 19A connected to the lower nozzle part 12b of the nozzle 11 in the reaction chamber 10 is opened, through which ammonia gas ($NH_3$) is introduced as a first reactive material gas from the gas source 18A into the chamber 10. At the same time, the valve 23 is opened and the valve 24 is opened relative to the chamber 10 alone and, further, the pump system 22 is activated, raising the pressure in the chamber 10 to 3 Torr. Then the valve 15B connected to the upper nozzle parts 12a of the nozzle 11 is opened, through which disilane ($Si_2H_6$) is introduced as a second reactive material gas from the gas source 143 into the chamber 10 to provide therein a gas mixture of the ammonia gas and the disilane. The pressure in the chamber 10 is held at 3 Torr by regulating the valve 23. In this instance, exhaust pipes 38 and 48 between the chambers 30 and 40 and the reaction chamber 10 are heated by heaters 39 and 49 mounted thereon, respectively. Even if the gas mixture flows back from the reaction chamber 10 in the pipes 38 and 48 toward the chambers 30 and 40, it is vapor-decomposed by heat to deposit silicon nitride and silicon on the interior surfaces of the pipes 38 and 48, preventing the silicon nitride and silicon from deposition on the inside surfaces of the chambers 30 and 40. Furthermore, in order to prevent such a reverse flowing of the gas mixture, the valve 36 is opened, through which nitrogen or argon gas is introduced from the gas source 35 into the chambers 30 and 40.

In such a condition, the gas mixture is excited by light from the light source 31 desposed in the light source chamber 31, by which it is excited and vapor-decomposed, depositing a first silicon nitride layer as a first insulating layer on the substrate 90 at a rate of 17 A/min.

(15) Next, when the first silicon nitride layer is deposited to a thickness of about 500 A on the substrate 90, the valve 23 is regulated and when the pressure in the chamber 10 is reduced to 1 Torr, the power source 15 is turned ON and then the light source 31 is turned OFF.

In such a condition, the gas mixture of the ammonia gas and the disilane is discharged or excited by electric power from the power source 15 into a plasma, in consequence of which a second silicon nitride layer is deposited as a second insulating layer on the first silicon nitride layer at a rate 2.1 A/sec.

(16) Next, when the second silicon nitride layer is deposited to a thickness of about 0.5 $\mu$m, the power source 15 is turned OFF and then the valves 15B 19A and 36 are closed but the valve 23 is fully opened, evacuating the chambers 10 and 30 to the same degree of vacuum as that under which the chamber 70 is held.

(17) Next, the valve 23 is closed and the pump system 22 is stopped and then the shutter means 71 is opened, through which the holder 81 carrying the substrate member 90 with the first and second insulating layers deposited thereon in this order is moved from the chamber 10 to the chamber 70.

(18) Next, the shutter means 71 is closed and then the valve 76 is opened, through which the prssure in the chamber 70 is raised to the atmospheric pressure.

(19) Next, the shutter means 72 is opened, through which the holder 81 is taken out to the outside and then the substrate member 90 having formed thereon the first and second insulating layers is removed from the holder 81.

In the manner described above, the insulating layer member as the layer member is formed on the substrate 90.

(20) Next, the holder 81 with no substrate member 90 mounted thereon is placed in the chamber 70, after which the shutter means 72 and the valve 76 are closed, the valve 24 is opend to the chamber 70 and the vacuum pump system 22 is put in operation, evacuating the chamber 70 to the same degree of vacuum as that under which the chamber 10 is retained.

(21) Next, the valve 24 is closed relative to the both chamers 70 and 10, after which the shutter means 71 is opened, through which the holder 81 is placed in the chamber 10, and then the shutter means 71 is closed.

(22) Next, the valve 19B connected to the lower nozzle parts 12b of the nozzle 11 is opened, through which nitrogen fluoride ($NF_3$) is introduced as a first cleaning gas form the gas source 18B into the chamber 10. On the other hand, the valve 23 is opened and the valve 24 is opened to the chamber 10 and then the pump system 22 is put in operation, holding the pressure in the chamber 10 at 0.1 Torr.

(23) Next, the power source 15 is turned ON.

In such a condition, the first cleaning gas is discharged or excited into a plasma by electric power from the power source 15, etching away unnecessary layers deposited on the inside surface of the chamber 10, the inside surfaces of the windows 33 and 34, the outside surface of the nozzle 11 and the outside surface of the holder 81. The unnecessary layers are composed of the materials of abovesaid first and second insulating layer.

(24) Next, when the unnecessary layers are almost etched away, the power source 15 is turned OFF and the valve 19B is closed, but the valve 19C is opened, through which hydrogen as a second cleaning gas, supplied from the gas source 18C, is introduced into the chamber 10, maintaining the pressure therein at 0.1 Torr.

(25) Next, the power source 15 is turned ON again. The second cleaning gas is discharged or excited into a plasma by electric power from the power source 15, cleaning the interior of the reaction chamber 10 including the windows 33 and 34, the nozzles 11 and the holder 81.

(26) Next, the power source 15 is turned OFF, after which the valve 19C is closed and the valve 23 is fully opened, through which the chamber 10 is evacuated. When the chamber 10 is evacuated to the same degree of vacuum as that under which the chamber 70 is retained, the valve 23 is closed, stopping the pump system 22 from operation.

Thus a series of steps for forming an insulating layer member as a layer member on a substrate is completed.

Embodiment 2

Next, a description will be given of a second embodiment of the present invention for forming a semiconductor layer member as a layer member on a substrate.

This embodiment forms an amorphous silicon layer as the semiconductor layer member on the substrate 90 by the same steps as those in Embodiment 1 except the following steps.

(12') In step (12) in Embodiment 1 the heating temperature of the substrate 90 is changed from 350 C. to 250 C.

(14') In step (14) of Embodiment 1 only the disilane ($Si_2H_6$) gas is introduced into the chamber 10 and the pressure in the chamber 10 is changed from 3 Torr to 2.5 Torr. A first amorphous silicon layer is deposited as a first semiconductor layer on the substrate 90.

(15') In step (15) of Embodiment 1, when the first amorphous silicon layer, instead of the first silicon nitride layer, is deposited about 1000 A thick on the substrate member 90, the disilane is discharged or excited into a plasma in place of the gas mixture of the ammonia and disilane, by which a second amorphous silicon layer is deposited as a second semiconductor layer on the first amorphous silicon layer.

(16') In step (16) of Embodiment 1, when the second amorphous silicon layer, instead of the silicon nitride layer, is deposited about 1000 A, the power source 15 is turned OFF.

Embodiment 3

Next, a description will be given of a third embodiment of the present invention which forms an aluminum nitride (AlN) layer member as a insulating layer member on a substrate.

Embodiment 3 employs a same steps as those in Embodiment 1 except the following steps.

(14') In step (14) of Embodiment 1 methyl aluminum ($Al(CH_3)_3$), instead of the disilane, is introduced from the gas source 14A into the chamber 10, whereby a first aluminum nitride (AlN) layer is deposited as a first insulating layer on the substrate 90. In this case, the deposition rate of the first aluminum nitride layer is 230 A/min.

(15') In step (15) of Embodiment 1 a second aluminum nitride layer, instead of the second silicon nitride layer, is deposited on the first aluminum nitride layer.

While in the foregoing the present invention has been described in connection with the cases of forming an insulating layer member having two insulating layers of the same material and a semiconductor layer member having two semiconductor layers of the same material, it is also possible to form an insulating layer member which has two insulating or protecting layers of different materials selected from a group consisting of, for example, $si_3N_4$, $SiO_2$, phosphate glass, borosilicate glass, and aluminum nitride. Also it is possible that an insulating or protecting layer of, for instance, the abovesaid insulating or protecting material and a conductive layer of such a metal as aluminum, iron, nickel or cobalt are formed in this order or in the reverse order to form a composite layer member. Furthermore, a semiconductor layer of a material selected from the group consisting of, for example, Si, $Si_xC_{1-x}$ (where 0<x<1), SiMX (where 0<x<4 and M is such a metal as Mo, W, In, Cr, Sn or Ga) and the abovesaid insulating or protecting or conductive layer can also be formed in this order or in the reverse order to obtain a composite layer member. Moreover, although in the foregoing a low pressure mercury lamp is employed as the light source, an excimer laser (of a wavelength 100 to 400 nm), an argon laser and a nitrogen laser can also be used.

It will be apparent that many modifications and variations may be effected with out departing from the scope of the novel concepts of the present invention.

What is claimed is:

1. A chemical vapor reaction method comprising the steps of:

preparing a pair of first and second electrodes within a reaction chamber, said pair of electrodes being arranged substantially in parallel with each other;

placing a substrate in a reaction chamber on said first electrode so that a first surface of said substrate faces toward said second electrode;

introducing a first film forming gas into said reaction chamber through said second electrode;

exciting said first film forming gas in order to form a first film by chemical vapor deposition on said substrate placed in said reaction chamber;

introducing a second film forming gas into said reaction chamber through said second electrode;

exciting said second film forming gas in order to form a second film by chemical vapor deposition on said first film in said reaction chamber;

removing said substrate from said reaction chamber after forming said second film;

introducing a cleaning gas into said reaction chamber through said second electrode;

exciting said cleaning gas in order to perform a cleaning in said reaction chamber.

2. A chemical vapor reaction method comprising the steps of:

preparing a pair of first and second electrodes within a reaction chamber, said pair of electrodes being arranged substantially in parallel with each other;

placing a substrate in a reaction chamber on said first electrode so that a first surface of said substrate faces toward said second electrode;

introducing a first film forming gas into said reaction chamber through said second electrode;

exciting said first film forming gas in order to form an insulating film by chemical vapor deposition on said substrate placed in said reaction chamber;

introducing a second film forming gas into said reaction chamber through said second electrode;

exciting said second film forming gas in order to form a semiconductor film by chemical vapor deposition on said insulating film in said reaction chamber;

removing said substrate from said reaction chamber after forming said semiconductor film;

introducing a cleaning gas into said reaction chamber through said second electrode;

exciting said cleaning gas in order to perform a cleaning in said reaction chamber.

3. A chemical vapor reaction method comprising the steps of:

preparing a pair of first and second electrodes within a reaction chamber, said pair of electrodes being arranged substantially in parallel with each other;

placing a substrate in a reaction chamber on said first electrode so that a first surface of said substrate faces toward said second electrode;

introducing a first film forming gas into said reaction chamber through said second electrode;

exciting said first film forming gas in order to form an insulating film by chemical vapor deposition on said substrate placed in said reaction chamber;

introducing a second film forming gas into said reaction chamber through said second electrode;

exciting said second film forming gas in order to form an amorphous silicon film by chemical vapor deposition on said insulating film in said reaction chamber;

removing said substrate from said reaction chamber after forming said amorphous silicon film;

introducing a cleaning gas into said reaction chamber through said second electrode;

exciting said cleaning gas in order to perform a cleaning in said reaction chamber.

4. The method of claim 3 wherein said insulating film comprises a material selected from the group consisting of silicon nitride, $SiO_2$, phosphate glass, boronsilicate glass and aluminum nitride.

5. A chemical vapor reaction method comprising the steps of:

preparing a pair of first and second electrodes within a reaction chamber, said pair of electrodes being arranged substantially in parallel with each other;

placing a substrate in a reaction chamber on said first electrode so that a first surface of said substrate faces toward said second electrode;

introducing a first film forming gas into said reaction chamber through said second electrode;

exciting said first film forming gas in order to form a semiconductor film by chemical vapor deposition on said substrate placed in said reaction chamber;

introducing a second film forming gas into said reaction chamber through said second electrode;

exciting said second film forming gas in order to form an insulating film by chemical vapor deposition on said semiconductor film in said reaction chamber;

removing said substrate from said reaction chamber after forming said insulating film;

introducing a cleaning gas into said reaction chamber through said second electrode;

exciting said cleaning gas in order to perform a cleaning in said reaction chamber.

6. A chemical vapor reaction method comprising the steps of;

preparing a pair of first and second electrodes within a reaction chamber, said pair of electrodes being arranged substantially in parallel with each other;

placing a substrate in a reaction chamber on said first electrode so that a first surface of said substrate faces toward said second electrode;

introducing a first film forming gas into said reaction chamber through said second electrode;

exciting said first film forming gas in order to form a amorphous silicon film by chemical vapor deposition on said substrate placed in said reaction chamber;

introducing a second film forming gas into said reaction chamber through said second electrode;

exciting said second film forming gas in order to form a silicon nitride film by chemical vapor deposition on said amorphous silicon film in said reaction chamber;

removing said substrate from said reaction chamber after forming said silicon nitride film;

introducing a cleaning gas into said reaction chamber through said second electrode;

exciting said cleaning gas in order to perform a cleaning in said reaction chamber.

7. A chemical vapor reaction method comprising the steps of:

preparing a pair of first and second electrodes within a reaction chamber, said pair of electrodes being arranged substantially in parallel with each other;

placing a substrate in a reaction chamber on said first electrode so that a first surface of said substrate faces toward said second electrode;

introducing a first film forming gas into said reaction chamber through said second electrode;

exciting said first film forming gas in order to form a first semiconductor film by chemical vapor deposition on said substrate placed in said reaction chamber;

introducing a second film forming gas into said reaction chamber through said second electrode;

exciting said second film forming gas in order to form a second semiconductor film by chemical vapor deposition on said first semiconductor film in said reaction chamber;

removing said substrate from said reaction chamber after forming said second semiconductor film;

introducing a cleaning gas into said reaction chamber through said second electrode;

exciting said cleaning gas in order to perform a cleaning in said reaction chamber.

8. The method of claim 7 wherein said first and second semiconductor are amorphous silicon.

9. The method of claims 7 or 8, wherein said first and second semiconductor are different type semiconductor.

10. The method of claims 7 or 8, wherein said first and second semiconductor are same type semiconductor.

11. A chemical vapor reaction method comprising the steps of:
preparing a pair of first and second electrodes within a reaction chamber, said pair of electrodes being arranged substantially in parallel with each other;
placing a substrate in a reaction chamber on said first electrode so that a first surface of said substrate faces toward said second electrode;
introducing a first film forming gas into said reaction chamber through said second electrode;
exciting said first film forming gas in order to form a first silicon nitride film by chemical vapor deposition on said substrate placed in said reaction chamber;
introducing a second film forming gas into said reaction chamber through said second electrode;
exciting said second film forming gas in order to form a second silicon nitride film by chemical vapor deposition on said first silicon nitride film in said reaction chamber;
removing said substrate from said reaction chamber after forming said second silicon nitride film;
introducing a cleaning gas into said reaction chamber through said second electrode;
exciting said cleaning gas in order to perform a cleaning in said reaction chamber.

12. The method of claim 11 wherein said first and second silicon nitride are different type.

13. The method of claim 11 wherein said first and second silicon nitride are same type.

14. A chemical vapor reaction method comprising the steps of:
preparing a pair of first and second electrodes within a reaction chamber, said pair of electrodes being arranged substantially in parallel with each other;
placing a substrate in a reaction chamber on said first electrode so that a first surface of said substrate faces toward said second electrode;
introducing a first film forming gas into said reaction chamber though said second electrode;
exciting said first film forming gas in order to form a SiO2 film by chemical vapor deposition on said substrate placed in said reaction chamber;
introducing a second film forming gas into said reaction chamber through said second electrode;
exciting said second film forming gas in order to form a silicon nitride film by chemical vapor deposition on said SiO2 film in said reaction chamber;
removing said substrate from said reaction chamber after forming said silicon nitride film;
introducing a cleaning gas into said reaction chamber through said second electrode,
exciting said cleaning gas in order to perform a cleaning in said reaction chamber.

15. The method of claims 1, 2, 3, 5, 6, 7, 11 or 14, wherein said chemical vapor deposition is a plasma CVD.

16. The method of claims 1, 2, 3, 5, 6, 7, 11 or 14, wherein said cleaning gas is a nitrogen fluoride.

17. A chemical vapor reaction method according to claims 1, 2, 3, 5, 6, 7, 11 or 14 wherein said cleaning gas is excited into a plasma to perform said cleaning.

18. A chemical vapor reaction method comprising the steps of:
introducing a first reactive gas into a reaction chamber;
exciting said first reactive gas to form a first film over a substrate;
introducing a second reactive gas into said reaction chamber after the formation of said first film;
exciting said second reactive gas to form a second film on said first film wherein said first film comprises one of a semiconductor material and an insulating material while the second film comprises the other one of the semiconductor material and the insulating material;
introducing a cleaning gas comprising nitrogen fluoride into said reaction chamber; and
exciting said cleaning gas in order to perform a cleaning in an inside of said reaction chamber.

19. A method according to claim 18 wherein said semiconductor material comprises amorphous silicon and said insulating material comprises silicon nitride or aluminum nitride.

20. A method according to claim 18 further comprising a step of cleaning with hydrogen after the cleaning with said nitrogen fluoride.

21. A chemical reaction method comprising the steps of:
preparing a reaction chamber connected with an evacuation system;
introducing a reactive gas into the reaction chamber;
exciting said reactive gas to form a film over a substrate in said reaction chamber;
introducing a cleaning gas into said reaction chamber after the formation of said film;
exciting said reactive gas to perform a cleaning in said reaction chamber;
wherein said reaction chamber is evacuated during performing said cleaning by said evacuation system.

22. A method according to claim 21 wherein said evacuation system includes a turbo-molecular pump and a control valve disposed between said reaction chamber and said turbo-molecular pump.

23. A method according to claim 21 wherein said cleaning gas comprises nitrogen fluoride.

24. A chemical reaction method comprising the steps of:
preparing a reaction chamber connected with an evacuation system;
introducing a reactive gas into the reaction chamber;
exciting said reactive gas to form a film over a substrate in said reaction chamber wherein said substrate is horizontally arranged in said reaction chamber;
introducing a cleaning gas into said reaction chamber after the formation of said film through a plurality of ports placed in said reaction chamber;
exciting said reactive gas to perform a cleaning in said reaction chamber;
wherein plurality of ports are arranged horizontally in said reaction chamber.

* * * * *